(12) United States Patent
Yoon

(10) Patent No.: US 9,336,903 B2
(45) Date of Patent: May 10, 2016

(54) SEMICONDUCTOR APPARATUS

(71) Applicant: SK hynix Inc., Icheon-si Gyeonggi-do (KR)

(72) Inventor: Young Jun Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 332 days.

(21) Appl. No.: 14/016,385

(22) Filed: Sep. 3, 2013

(65) Prior Publication Data

US 2014/0347938 A1    Nov. 27, 2014

(30) Foreign Application Priority Data

May 23, 2013 (KR) ........................ 10-2013-0058203

(51) Int. Cl.
*G11C 7/00* (2006.01)
*G11C 29/12* (2006.01)
*G11C 29/36* (2006.01)
*G11C 29/48* (2006.01)

(52) U.S. Cl.
CPC ............ *G11C 29/1201* (2013.01); *G11C 29/36* (2013.01); *G11C 29/48* (2013.01)

(58) Field of Classification Search
CPC ..... G11C 29/1201; G11C 29/48; G11C 29/36
USPC ................................ 365/189.02, 189.11, 194
See application file for complete search history.

(56) References Cited

U.S. PATENT DOCUMENTS

2009/0122621 A1* 5/2009 Rho ..................... G11C 7/1006
365/189.11

FOREIGN PATENT DOCUMENTS

KR    1020030014216 A    2/2003
KR    1020100050933 A    5/2010

* cited by examiner

*Primary Examiner* — Richard Elms
*Assistant Examiner* — Mohammed A Bashar
(74) *Attorney, Agent, or Firm* — William Park & Associates Ltd.

(57) ABSTRACT

A semiconductor apparatus includes an input buffer configured to buffer data inputted through a data input/output pad; a data input control unit configured to transfer an output of the input buffer to a data input/output line in response to a write clock; a test loop control unit configured to output one of a signal of the data input/output line and test latch data in response to a test mode signal; a data output control unit configured to output an output of the test loop control unit in response to a read clock; an output inversion select unit configured to output an output signal of the data output control unit by inverting or non-inverting it; and an output buffer configured to buffer an output signal of the output inversion select unit and output a resultant signal to a node which is coupled with the data input/output pad and input buffer.

20 Claims, 5 Drawing Sheets

SEMICONDUCTOR APPARATUS

CROSS-REFERENCES TO RELATED APPLICATION

The present application claims priority under 35 U.S.C. §119(a) to Korean application number 10-2013-0058203, filed on May 23, 2013, in the Korean Intellectual Property Office, which is incorporated herein by reference in its entirety.

BACKGROUND

1. Technical Field

Various embodiments relate to a semiconductor integrated circuit, and more particularly, to a semiconductor apparatus.

2. Related Art

A general semiconductor apparatus is configured to store inputted data and output stored data.

The semiconductor apparatus is being developed to increase a data storage capacity and the speed of a data input/output operation.

The semiconductor apparatus has pads for inputting and outputting data from and to an external device (for example, a controller). In this regard, in order to increase the speed of the data input/output operation of the semiconductor apparatus, that is, in order to input and output a large amount of data to and from the semiconductor apparatus at a time, the number of pads may be increased.

However, as the number of pads for input/output of data increases in the semiconductor apparatus, a time required to test the semiconductor apparatus is lengthened. The reason to this resides in that, since the number of lines for electrically coupling test equipment with the semiconductor apparatus is limited, the number of semiconductor apparatuses capable of being tested at a time increases in the case where an increased number of lines are allocated to each semiconductor apparatus.

SUMMARY

A semiconductor apparatus which can constantly maintain a test time regardless of the number of pads for input/output of data is described herein.

In an embodiment of the present invention, a semiconductor apparatus includes: an input buffer configured to buffer data inputted through a data input/output pad; a data input control unit configured to transfer an output of the input buffer to a data input/output line in response to a write clock; a test loop control unit configured to output one of a signal of the data input/output line and test latch data in response to a test mode signal; a data output control unit configured to output an output of the test loop control unit in response to a read clock; an output inversion select unit configured to output an output signal of the data output control unit by inverting or non-inverting it; and an output buffer configured to buffer an output signal of the output inversion select unit and output a resultant signal to a node to which the data input/output pad and the input buffer are electrically coupled.

In an embodiment of the present invention, a semiconductor apparatus includes: a first data input/output control block constituted by a first input buffer, a first data input control unit, a first input inversion select unit, a first test data input/output control unit, a first test loop control unit, a first data output control unit, a first output inversion select unit, and a first output buffer; and a second data input/output control block constituted by a second input buffer, a second data input control unit, a second input inversion select unit, a second test data input/output control unit, a second test loop control unit, a second data output control unit, a second output inversion select unit, and a second output buffer, wherein, in a test, the first test data input/output control unit latches test data and outputs first test latch data, and the first test latch data is latched again by the first test data input/output control unit by being circulated through the first test loop control unit, the first data output control unit, the first output inversion select unit, the first output buffer, the first input buffer and the first input inversion select unit, and wherein, in the test, the second test data input/output control unit latches the first test latch data and outputs second test latch data, and the second test latch data is latched again by the second test data input/output control unit by being circulated through the second test loop control unit, the second data output control unit, the second output inversion select unit, the second output buffer, the second input buffer and the second input inversion select unit.

In an embodiment of the present invention, a semiconductor apparatus includes: a first data input/output control block including a first data transfer path for transferring data inputted through a first data input/output pad, to a first data input/output line, and a second data transfer path for outputting a signal of the first data input/output line through the first data input/output pad, in a normal, and configured to latch test data and transfer and circulate latched test data to the first data transfer path and the second data transfer path, in a test; and a second data input/output control block including a third data transfer path for transferring data inputted through a second data input/output pad, to a second data input/output line, and a second data transfer path for outputting a signal of the second data input/output line through the second data input/output pad, in the normal, and configured to latch the signal of the first data input/output line and transfer and circulate latched signal to the third data transfer path and the fourth data transfer path, in the test.

In an embodiment of the present invention, a semiconductor apparatus includes: an input buffer configured to buffer data inputted through a data input/output pad; a data input control unit configured to transfer an output of the input buffer to a data input/output line in response to a write clock; a test loop control unit configured to output one of a signal of the data input/output line and test latch data in response to a test mode signal; a data output control unit configured to output an output of the test loop control unit in response to a read clock; an output inversion select unit configured to output an output signal of the data output control unit in response to a test control signal; and an output buffer configured to buffer an output signal of the output inversion select unit and output a resultant signal to a node to which the data input/output pad and the input buffer are electrically coupled.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through various examples of embodiments.

Figure 1:
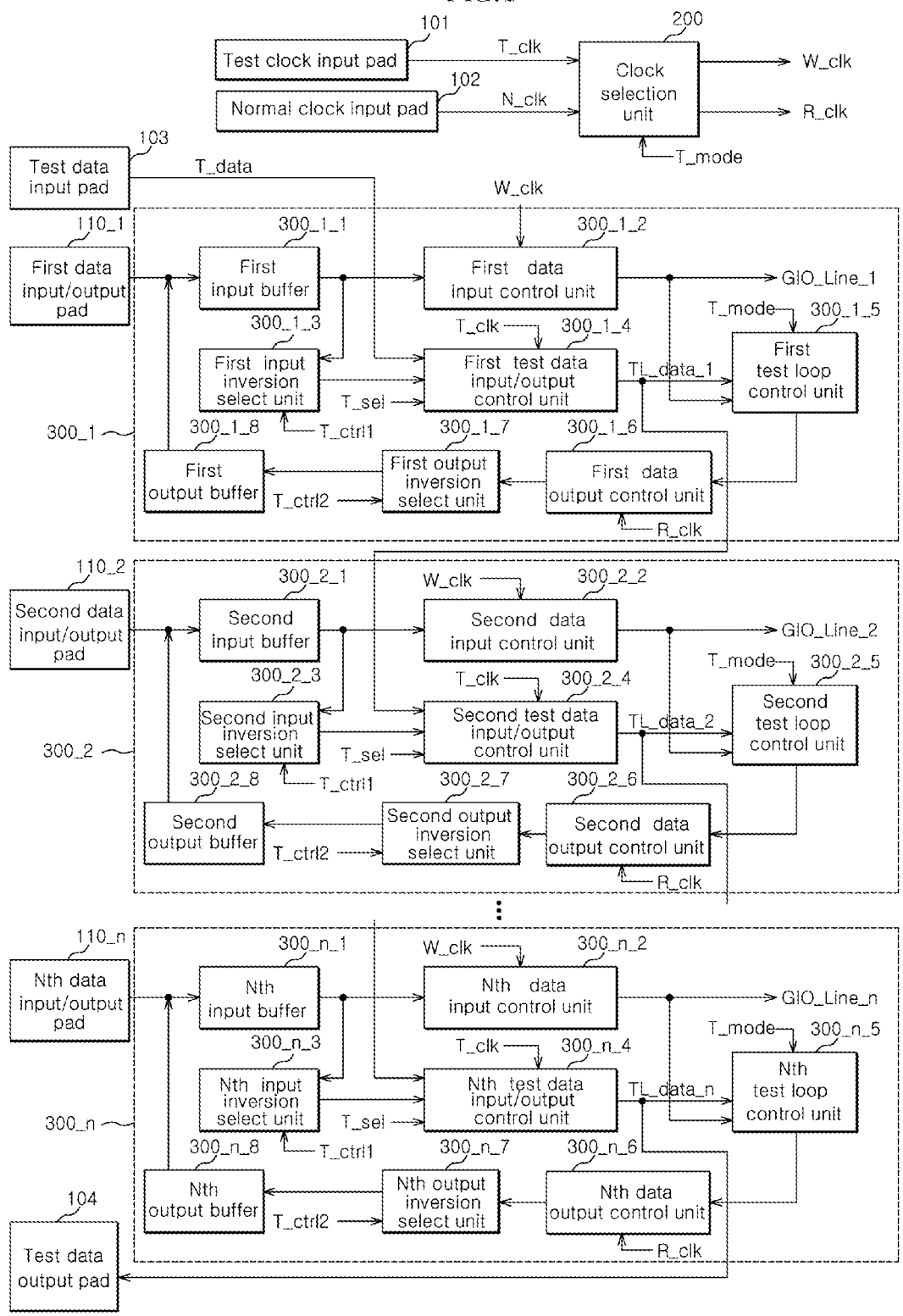
FIG. 1 is a configuration diagram of a semiconductor apparatus in accordance with an embodiment.

Referring to FIG. 1, a semiconductor apparatus in accordance with an embodiment may include a test clock input pad 101, a normal clock input pad 102, a test data input pad 103, first to $n^{th}$ data input/output pads 110_1 to 110_n, a test data output pad 104, a clock selection unit 200, and first to $n^{th}$ data input/output control blocks 300_1 to 300_n.

The test clock input pad 101 may be configured to transfer a test clock T_clk from an outside to an inside of the semiconductor apparatus in a test.

The normal clock input pad 102 may be configured to transfer a normal clock N_clk from an outside to an inside of the semiconductor apparatus not in a test mode but in a normal mode.

The test data input pad 103 may be configured to transfer test data T_data from an outside to an inside of the semiconductor apparatus in the test mode.

Each of the first to $n^{th}$ data input/output pads 110_1 to 110_n may be configured to transfer data from an outside to an inside of the semiconductor apparatus in a normal mode.

The test data output pad 104 may be configured to transfer the data outputted from an inside of the semiconductor apparatus to an outside of the semiconductor apparatus in the test mode. For example, the test data output pad 104 transfers the data outputted from the $n^{th}$ data input/output control block 300_n to an outside of the semiconductor apparatus.

The clock selection unit 200 may be configured to output the normal clock N_clk as a write clock W_clk and a read clock R_clk in the normal, and output the test clock T_clk as the read clock R_clk and fix the write clock W_clk to a specified level in the test mode. For example, the clock selection unit 200 outputs the normal clock N_clk as the write clock W_clk and the read clock R_clk when a test mode signal T_mode is disabled. Also, the clock selection unit 200 outputs the test clock T_clk as the read clock R_clk and fixes the write clock W_clk to the level of a ground voltage (not shown in FIG. 1) when the test mode signal T_mode is enabled.

Figure 2:
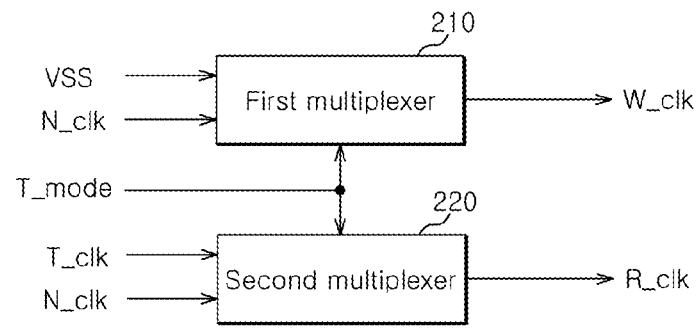
FIG. 2 is a configuration diagram of the clock selection unit of FIG. 1.

Referring to FIG. 2, the clock selection unit 200 may include first and second multiplexers 210 and 220. The first multiplexer 210 outputs one of the normal clock N_clk and the ground voltage VSS as the write clock W_clk in response to the test mode signal T_mode. For example, the first multiplexer 210 outputs the ground voltage VSS as the write clock W_clk when the test mode signal T_mode is enabled, and outputs the normal clock N_clk as the write clock W_clk when the test mode signal T_mode is disabled. The second multiplexer 220 outputs one of the test clock T_clk and the normal clock N_clk as the read clock R_clk in response to the test mode signal T_mode. For example, the second multiplexer 220 outputs the test clock T_clk as the read clock R_clk when the test mode signal T_mode is enabled, and outputs the normal clock N_clk as the read clock R_clk when the test mode signal T_mode is disabled.

The first data input/output control block 300_1 may be configured to transfer the data inputted from the first data input/output pad 110_1, to a first data input/output line GIO_line_1, and transfer the data inputted from the first data input/output line GIO_line_1, to the first data input/output pad 110_1, in a normal mode. Further, the first data input/output control block 300_1 may be configured to latch the test data T_data inputted from the test data input pad 103, as first test latch data TL_data_1, and transfer the first test latch data TL_data_1 to the second data input/output control block 300_2, in the test mode.

The first data input/output control block 300_1 may include a first input buffer 300_1_1, a first data input control unit 300_1_2, a first input inversion select unit 300_1_3, a first test data input/output control unit 300_1_4, a first test loop control unit 300_1_5, a first data output control unit 300_1_6, a first output inversion select unit 300_1_7, and a first output buffer 300_1_8.

The first input buffer 300_1_1 is electrically coupled with the first data input/output pad 110_1 and may be configured to buffer and output the data inputted from the first data input/output pad 110_1.

The first data input control unit 300_1_2 may be configured to output the output of the first input buffer 300_1_1 to the first data input/output line GIO_line_1 in response to the write clock W_clk. For example, the first data input control unit 300_1_2 is activated when the write clock W_clk is a signal which periodically transitions, and outputs the output of the first input buffer 300_1_1 to the first data input/output line GIO_line_1. The first data input control unit 300_1_2 is deactivated when the write clock W_clk is a signal which is fixed to the specified level.

The first input inversion select unit 300_1_3 may be configured to output the output of the first input buffer 300_1_1 by inverting or non-inverting it in response to a first test control signal T_ctrl1. For example, the first input inversion select unit 300_1_3 outputs the output of the first input buffer 300_1_1 by inverting it when the first test control signal T_ctrl1 is enabled, and outputs the output of the first input buffer 300_1_1 by non-inverting it when the first test control signal T_ctrl1 is disabled.

Figure 3:
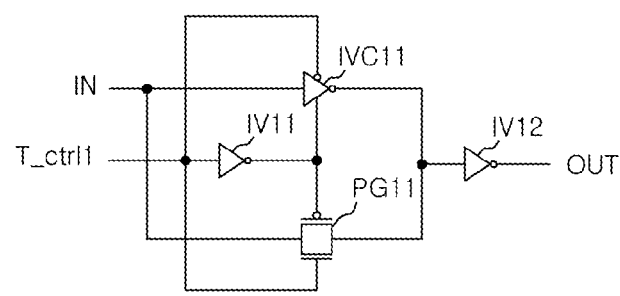
FIG. 3 is a configuration diagram of the first input inversion select unit of FIG. 1.

Referring to FIG. 3, the first input inversion select unit 300_1_3 may include first and second inverters IV11 and IV12, a control inverter IVC11, and a pass gate PG11. The first inverter IV11 is inputted with the first test control signal T_ctrl1. The control inverter IVC11 has a first control terminal which is inputted with the first test control signal T_ctrl1, a second control terminal which is inputted with the output signal of the first inverter IV11, and an input terminal which is inputted with an input signal IN, that is, the output signal of the first input buffer 300_1_1. The pass gate PG11 has a first control terminal which is inputted with the output signal of the first inverter IV11, a second control terminal which is inputted with the first test control signal T_ctrl1, and an input terminal which is inputted with the input signal IN, that is, the output signal of the first input buffer 300_1_1. The output terminal of the control inverter IVC11 and the output terminal of the pass gate PG11 are electrically coupled with each other. The second inverter IV12 has an input terminal to which the electrically coupled node of the output terminals of the control inverter IVC11 and the pass gate PG11 is electrically coupled, and an output terminal which outputs an output signal OUT.

The first test data input/output control unit 300_1_4 may be configured to latch one of the test data T_data inputted from the test data input pad 103 in response to a test select signal T_sel and the output signal of the first input inversion select unit 300_1_3, in response to the test clock T_clk, and output the latched data as the first test latch data TL_data_1. For example, the first test data input/output control unit 300_1_4 latches the test data T_data when the test clock T_clk transitions to a specified level if the test select signal T_sel has been enabled and outputs the first test latch data TL_data_1, and latches the output signal of the first input inversion select unit 300_1_3 when the test clock T_clk transitions to the specified level if the test select signal T_sel has been disabled and outputs the first test latch data TL_data_1.

Figure 4:
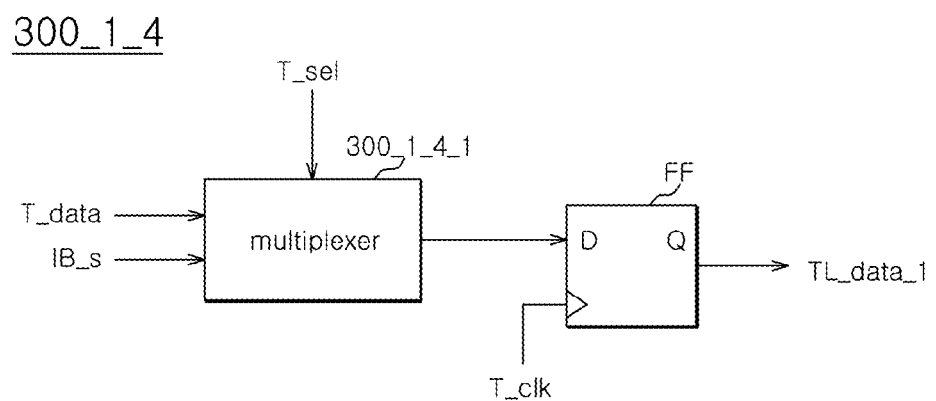
FIG. 4 is a configuration diagram of the first test data input/output control unit of FIG. 1.

Referring to FIG. 4, the first test data input/output control unit 300_1_4 may include a multiplexer 300_1_4_1 and a flip-flop FF. The multiplexer 300_1_4_1 selects and outputs one of the test data T_data and an output signal IB_s of the first input inversion select unit 300_1_3 in response to the test select signal T_sel. For example, the multiplexer 300_1_4_1 outputs the test data T_data when the test select signal T_sel is enabled, and outputs the output signal IB_s of the first input inversion select unit 300_1_3 when the test select signal T_sel is disabled. The flip-flop FF latches the output signal of the multiplexer 300_1_4_1 when the test clock T_clk transitions to the specified level (i.e., a high level), and outputs the first test latch data TL_data_1.

The first test loop control unit 300_1_5 may be configured to output one of the signal of the first data input/output line GIO_line_1 and the first test latch data TL_data_1 in response to the test mode signal T_mode. For example, the first test loop control unit 300_1_5 outputs the first test latch data TL_data_1 when the test mode signal T_mode is enabled, and outputs the signal of the first data input/output line GIO_line_1 when the test mode signal T_mode is disabled. The first test loop control unit 300_1_5 may be configured by a multiplexer.

The first data output control unit 300_1_6 may be configured to output the output signal of the first test loop control unit 300_1_5 in response to the read clock R_clk.

The first output inversion select unit 300_1_7 may be configured to output the output signal of the first data output control unit 300_1_6 by inverting or non-inverting it in response to a second test control signal T_ctrl2. For example, the first output inversion select unit 300_1_7 outputs the output signal of the first data output control unit 300_1_6 by inverting it when the second test control signal T_ctrl2 is enabled, and outputs the output signal of the first data output control unit 300_1_6 by non-inverting it when the second test control signal T_ctrl2 is disabled. The first output inversion select unit 300_1_7 may be configured in the same manner as the first input inversion select unit 300_1_3 except that input signals and output signals are different.

The first output buffer 300_1_8 may be configured to buffer the output of the first output inversion select unit 300_1_7 and output a resultant signal to the node to which the first data input/output pad 110_1 and the first input buffer 300_1_1 are electrically coupled.

The second data input/output control block 300_2 may be configured to transfer the data inputted from the second data input/output pad 110_2, to a second data input/output line GIO_line_2, and transfer the data inputted from the second data input/output line GIO_line_2, to the second data input/output pad 110_2, in the normal mode. Further, the second data input/output control block 300_2 may be configured to latch the first test latch data TL_data_1 inputted from the first data input/output control block 300_1, as second test latch data TL_data_2, and transfer the second test latch data TL_data_2 to the third data input/output control block, in the test mode.

The second data input/output control block 300_2 may include a second input buffer 300_2_1, a second data input control unit 300_2_2, a second input inversion select unit 300_2_3, a second test data input/output control unit 300_2_4, a second test loop control unit 300_2_5, a second data output control unit 300_2_6, a second output inversion select unit 300_2_7, and a second output buffer 300_2_8.

The second input buffer 300_2_1 is electrically coupled with the second data input/output pad 110_2 and may be configured to buffer and output the data inputted from the second data input/output pad 110_2.

The second data input control unit 300_2_2 may be configured to output the output of the second input buffer 300_2_1 to the second data input/output line GIO_line_2 in response to the write clock W_clk. For example, the second data input control unit 300_2_2 is activated when the write clock W_clk is the signal which periodically transitions, and outputs the output of the second input buffer 300_2_1 to the second data input/output line GIO_line_2. The second data input control unit 300_2_2 is deactivated when the write clock W_clk is the signal which is fixed to the specified level.

The second input inversion select unit 300_2_3 may be configured to output the output of the second input buffer 300_2_1 by inverting or non-inverting it in response to the first test control signal T_ctrl1. For example, the second input inversion select unit 300_2_3 outputs the output of the second input buffer 300_2_1 by inverting it when the first test control signal T_ctrl1 is enabled, and outputs the output of the second input buffer 300_2_1 by non-inverting it when the first test control signal T_ctrl1 is disabled.

The second input inversion select unit 300_2_3 may be configured in the same manner as the first input inversion select unit 300_1_3 except that input signals and output signals are different.

The second test data input/output control unit 300_2_4 may be configured to latch one of the first test latch data TL_data_1 inputted from the first data input/output control block 300_1 in response to the test select signal T_sel and the output signal of the second input inversion select unit 300_2_3, in response to the test clock T_clk, and output the latched data as the second test latch data TL_data_2. For example, the second test data input/output control unit 300_2_4 latches the first test latch data TL_data_1 when the test clock T_clk transitions to the specified level if the test select signal T_sel has been enabled and outputs the second test latch data TL_data_2, and latches the output signal of the second input inversion select unit 300_2_3 when the test clock T_clk transitions to the specified level if the test select signal T_sel has been disabled and outputs the second test latch data TL_data_2.

The second test data input/output control unit 300_2_4 may be configured in the same manner as the first test data input/output control unit 300_1_4 except that input signals and output signals are different.

The second test loop control unit 300_2_5 may be configured to output one of the signal of the second data input/output line GIO_line_2 and the second test latch data TL_data_2 in response to the test mode signal T_mode. For example, the second test loop control unit 300_2_5 outputs the second test latch data TL_data_2 when the test mode signal T_mode is enabled, and outputs the signal of the second data input/output line GIO_line_2 when the test mode signal T_mode is disabled. The second test loop control unit 300_2_5 may be configured by a multiplexer.

The second data output control unit 300_2_6 may be configured to output the output signal of the second test loop control unit 300_2_5 in response to the read clock R_clk.

The second output inversion select unit 300_2_7 may be configured to output the output signal of the second data output control unit 300_2_6 by inverting or non-inverting it in response to the second test control signal T_ctrl2. For example, the second output inversion select unit 300_2_7 outputs the output signal of the second data output control unit 300_2_6 by inverting it when the second test control signal T_ctrl2 is enabled, and outputs the output signal of the second data output control unit 300_2_6 by non-inverting it when the second test control signal T_ctrl2 is disabled. The second output inversion select unit 300_2_7 may be configured in the same manner as the first input inversion select unit 300_1_3 except that input signals and output signals are different.

The second output buffer 300_2_8 may be configured to buffer the output of the second output inversion select unit 300_2_7 and output a resultant signal to the node to which the second data input/output pad 110_2 and the second input buffer 300_2_1 are electrically coupled.

The $n^{th}$ data input/output control block 300_n may be configured to transfer the data inputted from the $n^{th}$ data input/output pad 110_n, to an $n^{th}$ data input/output line GIO_line_n, and transfer the data inputted from the $n^{th}$ data input/output line GIO_line_n, to the $n^{th}$ data input/output pad 110_n, in the normal mode. Further, the $n^{th}$ data input/output control block 300_n may be configured to latch n-1$^{th}$ test latch data inputted from the n-1$^{th}$ data input/output control block, as $n^{th}$ test latch data TL_data_n, and transfer the $n^{th}$ test latch data TL_data_n to the test data output pad 104, in the test mode.

The $n^{th}$ data input/output control block 300_n may include an $n^{th}$ input buffer 300_n_1, an $n^{th}$ data input control unit 300_n_2, an $n^{th}$ input inversion select unit 300_n_3, an $n^{th}$ test data input/output control unit 300_n_4, an $n^{th}$ test loop control unit 300_n_5, an $n^{th}$ data output control unit 300_n_6, an $n^{th}$ output inversion select unit 300_n_7, and an $n^{th}$ output buffer 300_n_8.

The $n^{th}$ input buffer 300_n_1 is electrically coupled with the $n^{th}$ data input/output pad 110_n and may be configured to buffer and output the data inputted from the $n^{th}$ data input/output pad 110_n.

The $n^{th}$ data input control unit 300_n_2 may be configured to output the output of the $n^{th}$ input buffer 300_n_1 to the $n^{th}$ data input/output line GIO_line_n in response to the write clock W_clk. For example, the $n^{th}$ data input control unit 300_n_2 is activated when the write clock W_clk is the signal which periodically transitions, and outputs the output of the $n^{th}$ input buffer 300_n_1 to the $n^{th}$ data input/output line GIO_line_n. The $n^{th}$ data input control unit 300_n_2 is deactivated when the write clock W_clk is the signal which is fixed to the specified level.

The $n^{th}$ input inversion select unit 300_n_3 may be configured to output the output of the $n^{th}$ input buffer 300_n_1 by inverting or non-inverting it in response to the first test control signal T_ctrl1. For example, the $n^{th}$ input inversion select unit 300_n_3 outputs the output of the $n^{th}$ input buffer 300_n_1 by inverting it when the first test control signal T_ctrl1 is enabled, and outputs the output of the $n^{th}$ input buffer 300_n_1 by non-inverting it when the first test control signal T_ctrl1 is disabled. The $n^{th}$ input inversion select unit 300_n_3 may be configured in the same manner as the first input inversion select unit 300_1_3 except that input signals and output signals are different.

The $n^{th}$ test data input/output control unit 300_n_4 may be configured to latch one of the n-1$^{th}$ test latch data inputted from the n-1$^{th}$ data input/output control block in response to the test select signal T_sel and the output signal of the $n^{th}$ input inversion select unit 300_n_3, in response to the test clock T_clk, and output the latched data as the $n^{th}$ test latch data TL_data_n. For example, the $n^{th}$ test data input/output control unit 300_n_4 latches the n-1$^{th}$ test latch data when the test clock T_clk transitions to the specified level if the test select signal T_sel has been enabled and outputs the $n^{th}$ test latch data TL_data_n, and latches the output signal of the $n^{th}$ input inversion select unit 300_n_3 when the test clock T_clk transitions to the specified level if the test select signal T_sel has been disabled and outputs the $n^{th}$ test latch data TL_data_n.

The $n^{th}$ test data input/output control unit 300_n_4 may be configured in the same manner as the first test data input/output control unit 300_1_4 except that input signals and output signals are different.

The $n^{th}$ test loop control unit 300_n_5 may be configured to output one of the signal of the $n^{th}$ data input/output line GIO_line_n and the $n^{th}$ test latch data TL_data_n in response to the test mode signal T_mode. For example, the $n^{th}$ test loop control unit 300_n_5 outputs the $n^{th}$ test latch data TL_data_n when the test mode signal T_mode is enabled, and outputs the signal of the $n^{th}$ data input/output line GIO_line_n when the test mode signal T_mode is disabled. The $n^{th}$ test loop control unit 300_n_5 may be configured by a multiplexer.

The $n^{th}$ data output control unit 300_n_6 may be configured to output the output signal of the $n^{th}$ test loop control unit 300_n_5 in response to the read clock R_clk.

The $n^{th}$ output inversion select unit 300_n_7 may be configured to output the output signal of the $n^{th}$ data output control unit 300_n_6 by inverting or non-inverting it in response to the second test control signal T_ctrl2. For example, the $n^{th}$ output inversion select unit 300_n_7 outputs the output signal of the $n^{th}$ data output control unit 300_n_6 by inverting it when the second test control signal T_ctrl2 is enabled, and outputs the output signal of the $n^{th}$ data output control unit 300_n_6 by non-inverting it when the second test control signal T_ctrl2 is disabled. The $n^{th}$ output inversion select unit 300_n_7 may be configured in the same manner as the first input inversion select unit 300_1_3 except that input signals and output signals are different.

The $n^{th}$ output buffer 300_n_8 may be configured to buffer the output of the $n^{th}$ output inversion select unit 300_n_7 and output a resultant signal to the node to which the $n^{th}$ data input/output pad 110_n and the $n^{th}$ input buffer 300_n_1 are electrically coupled.

Operations of the semiconductor apparatus in accordance with the embodiments, configured as mentioned above, will be described below.

Operations in the normal mode, that is, in the case where the test mode signal T_mode is disabled and data are inputted from an outside to the semiconductor apparatus, will be described.

The clock selection unit 200 outputs the normal clock N_clk as the write clock W_clk and the read clock R_clk when the test mode signal T_mode is disabled.

The first data input/output control block 300_1 transfers the data inputted from the first data input/output pad 110_1, through the first input buffer 300_1_1 and the first data input control unit 300_1_2 to the first data input/output line GIO_line_1. The first data input control unit 300_1_2 is activated and operates in response to the write clock W_clk.

The second data input/output control block 300_2 transfers the data inputted from the second data input/output pad 110_2, through the second input buffer 300_2_1 and the second data input control unit 300_2_2 to the second data input/output line GIO_line_2. The second data input control unit 300_2_2 is activated and operates in response to the write clock W_clk.

The $n^{th}$ data input/output control block 300_n transfers the data inputted from the $n^{th}$ data input/output pad 110_n, through the $n^{th}$ input buffer 300_n_1 and the $n^{th}$ data input control unit 300_n_2 to the $n^{th}$ data input/output line GIO_line_n. The $n^{th}$ data input control unit 300_n_2 is activated and operates in response to the write clock W_clk.

Operations in the normal mode, that is, in the case where the test mode signal T_mode is disabled and data are outputted from the semiconductor apparatus to an outside, will be described.

The clock selection unit 200 outputs the normal clock N_clk as the write clock W_clk and the read clock R_clk when the test mode signal T_mode is disabled.

The first data input/output control block 300_1 outputs the data inputted from the first data input/output line GIO_line_1, through the first test loop control unit 300_1_5, the first data output control unit 300_1_6, the first output inversion select unit 300_1_7, the first output buffer 300_1_8 and the first data input/output pad 110_1 to an outside of the semiconductor apparatus. Since the test mode signal T_mode is disabled, the first test loop control unit 300_1_5 transfers the signal of the first data input/output line GIO_line_1 to the first data output control unit 300_1_6. The first data output control unit 300_1_6 outputs the output signal of the first test loop control unit 300_1_5 in response to the read clock R_clk. The first output inversion select unit 300_1_7 outputs the output signal of the first data output control unit 300_1_6 by non-inverting it in response to the disabled second test control signal T_ctrl2. The first output buffer 300_1_8 outputs the output signal of the first output inversion select unit 300_1_7 to the first data input/output pad 110_1.

The second data input/output control block 300_2 outputs the data inputted from the second data input/output line GIO_line_2, through the second test loop control unit 300_2_5, the second data output control unit 300_2_6, the second output inversion select unit 300_2_7, the second output buffer 300_2_8 and the second data input/output pad 110_2 to an outside of the semiconductor apparatus. Since the test mode signal T_mode is disabled, the second test loop control unit 300_2_5 transfers the signal of the second data input/output line GIO_line_2 to the second data output control unit 300_2_6. The second data output control unit 300_2_6 outputs the output signal of the second test loop control unit 300_2_5 in response to the read clock R_clk. The second output inversion select unit 300_2_7 outputs the output signal of the second data output control unit 300_2_6 by non-inverting it in response to the disabled second test control signal T_ctrl2. The second output buffer 300_2_8 outputs the output signal of the second output inversion select unit 300_2_7 to the second data input/output pad 110_2.

The $n^{th}$ data input/output control block 300_$n$ outputs the data inputted from the $n^{th}$ data input/output line GIO_line_n, through the $n^{th}$ test loop control unit 300_$n$_5, the $n^{th}$ data output control unit 300_$n$_6, the $n^{th}$ output inversion select unit 300_$n$_7, the $n^{th}$ output buffer 300_$n$_8 and the $n^{th}$ data input/output pad 110_$n$ to an outside of the semiconductor apparatus. Since the test mode signal T_mode is disabled, the $n^{th}$ test loop control unit 300_$n$_5 transfers the signal of the $n^{th}$ data input/output line GIO_line_n to the $n^{th}$ data output control unit 300_$n$_6. The $n^{th}$ data output control unit 300_$n$_6 outputs the output signal of the $n^{th}$ test loop control unit 300_$n$_5 in response to the read clock R_clk. The $n^{th}$ output inversion select unit 300_$n$_7 outputs the output signal of the $n^{th}$ data output control unit 300_$n$_6 by non-inverting it in response to the disabled second test control signal T_ctrl2. The $n^{th}$ output buffer 300_$n$_8 outputs the output signal of the $n^{th}$ output inversion select unit 300_$n$_7 to the $n^{th}$ data input/output pad 110_$n$.

Operations not in the normal mode but in the test mode, that is, in the case where the test mode signal T_mode is enabled, will be described.

When the test mode signal T_mode is enabled, the clock selection unit 200 outputs the test clock T_clk as the read clock R_clk and fixes the write clock W_clk to the specified level.

The test select signal T_sel is enabled, and thereafter, the test data T_data is applied from the test data input pad 103.

When the test select signal T_sel is enabled, the first test data input/output control unit 300_1_4 latches the test data T_data at a timing when the test clock T_clk transitions to the specified level, and outputs the latched data as the first test latch data TL_data_1.

When the test select signal T_sel is enabled, the second test data input/output control unit 300_2_4 latches the first test latch data TL_data_1 at a timing when the test clock T_clk transitions to the specified level, and outputs the latched data as the second test latch data TL_data_2.

When the test select signal T_sel is enabled, the $n^{th}$ test data input/output control unit 300_$n$_4 latches the n−$1^{th}$ test latch data at a timing when the test clock T_clk transitions to the specified level, and outputs the latched data as the $n^{th}$ test latch data TL_data_n.

After the test data T_data is latched by all of the first to $n^{th}$ respective test data input/output control units 300_1_4 to 300_$n$_4, the test select signal T_sel is disabled.

The first test latch data TL_data_1 latched by the first test data input/output control unit 300_1_4 is transferred back to the first test data input/output control unit 300_1_4 via the first test loop control unit 300_1_5, the first data output control unit 300_1_6, the first output inversion select unit 300_1_7, the first output buffer 300_1_8, the first input buffer 300_1_1 and the first input inversion select unit 300_1_3 after the test select signal T_sel is disabled. That is to say, after the test select signal T_sel is disabled, the first test latch data TL_data_1 is transferred by being circulated through the other component elements excluding the first data input control unit 300_1_2 among all the component elements constituting the first data input/output control block 300_1. The first input inversion select unit 300_1_3 outputs the output signal of the first input buffer 300_1_1 to the first test data input/output control unit 300_1_4 by non-inverting it in response to the disabled first test control signal T_ctrl1. The first output inversion select unit 300_1_7 outputs the output signal of the first data output control unit 300_1_6 to the first output buffer 300_1_8 by non-inverting it in response to the disabled second test control signal T_ctrl2. The first data input control unit 300_1_2 which is inputted with the write clock W_clk fixed to the specified level is deactivated. The data value of the first test latch data TL_data_1 transferred by being circulated may be changed by the first and second test control signals T_ctrl1 and T_ctrl2. For example, in the case where the first test control signal T_ctrl1 is enabled, the output signal of the first input buffer 300_1_1 may be transferred to the first test data input/output control unit 300_1_4 by being inverted. In the case where the second control signal T_ctrl2 is enabled, the output signal of the first data output control unit 300_1_6 may be transferred to the first output buffer 300_1_8 by being inverted.

The second test latch data TL_data_2 latched by the second test data input/output control unit 300_2_4 is transferred back to the second test data input/output control unit 300_2_4 via the second test loop control unit 300_2_5, the second data output control unit 300_2_6, the second output inversion select unit 300_2_7, the second output buffer 300_2_8, the second input buffer 300_2_1 and the second input inversion select unit 300_2_3 after the test select signal T_sel is disabled. That is to say, after the test select signal T_sel is disabled, the second test latch data TL_data_2 is transferred by being circulated through the other component elements excluding the second data input control unit 300_2_2 among all the component elements constituting the second data input/output control block 300_2. The second input inversion select unit 300_2_3 outputs the output signal of the second input buffer 300_2_1 to the second test data input/output control unit 300_2_4 by non-inverting it in response to the disabled first test control signal T_ctrl1. The second output inversion select unit 300_2_7 outputs the output signal of the second data output control unit 300_2_6 to the second output buffer 300_2_8 by non-inverting it in response to the disabled second test control signal T_ctrl2. The second data input control unit 300_2_2 which is inputted with the write clock W_clk fixed to the specified level is deactivated. The data value of the second test latch data TL_data_2 transferred by being circulated may be changed by the first and second test control signals T_ctrl1 and T_ctrl2. For example, in the case where the first test control signal T_ctrl1 is enabled, the output signal of the second input buffer 300_2_1 may be transferred to the second test data input/output control unit 300_2_4 by being inverted. In the case where the second control signal T_ctrl2 is enabled, the output signal of the second data output control unit 300_2_6 may be transferred to the second output buffer 300_2_8 by being inverted.

The $n^{th}$ test latch data TL_data_n latched by the $n^{th}$ test data input/output control unit 300_n_4 is transferred back to the $n^{th}$ test data input/output control unit 300_n_4 via the $n^{th}$ test loop control unit 300_n_5, the $n^{th}$ data output control unit 300_n_6, the $n^{th}$ output inversion select unit 300_n_7, the $n^{th}$ output buffer 300_n_8, the $n^{th}$ input buffer 300_n_1 and the $n^{th}$ input inversion select unit 300_n_3 after the test select signal T_sel is disabled. That is to say, after the test select signal T_sel is disabled, the $n^{th}$ test latch data TL_data_n is transferred by being circulated through the other component elements excluding the $n^{th}$ data input control unit 300_n_2 among all the component elements constituting the $n^{th}$ data input/output control block 300_n. The $n^{th}$ input inversion select unit 300_n_3 outputs the output signal of the $n^{th}$ input buffer 300_n_1 to the $n^{th}$ test data input/output control unit 300_n_4 by non-inverting it in response to the disabled first test control signal T_ctrl1. The $n^{th}$ output inversion select unit 300_n_7 outputs the output signal of the $n^{th}$ data output control unit 300_n_6 to the $n^{th}$ output buffer 300_n_8 by non-inverting it in response to the disabled second test control signal T_ctrl2. The $n^{th}$ data input control unit 300_n_2 which is inputted with the write clock W_clk fixed to the specified level is deactivated. The data value of the $n^{th}$ test latch data TL_data_n transferred by being circulated may be changed by the first and second test control signals T_ctrl1 and T_ctrl2. For example, in the case where the first test control signal T_ctrl1 is enabled, the output signal of the $n^{th}$ input buffer 300_n_1 may be transferred to the $n^{th}$ test data input/output control unit 300_n_4 by being inverted. In the case where the second control signal T_ctrl2 is enabled, the output signal of the $n^{th}$ data output control unit 300_n_6 may be transferred to the $n^{th}$ output buffer 300_n_8 by being inverted.

The test latch data TL_data_1, TL_data_2 and TL_data_n latched by the respective data input/output control blocks 300_1, 300_2 and 300_n are transferred by being circulated through the respective data input/output control blocks 300_1, 300_2 and 300_n in the case where the test select signal T_sel is disabled. Thereafter, when the test select signal T_sel is enabled, the data transferred by being circulated through the test data input/output control units 300_1_4, 300_2_4 and 300_n_4 of the respective data input/output control blocks 300_1, 300_2 and 300_n are sequentially outputted through the test data output pad 104.

The semiconductor apparatus in accordance with the embodiments do not receive the data transferred by being circulated through the respective data input/output pads 110_1, 110_2 and 110_n. Instead, in the semiconductor apparatus in accordance with the embodiments, data transferred from the one test data input pad 103 are sequentially latched by the respective test data input/output control units 300_1_4, 300_2_4 and 300_n_4 in response to the test clock T_clk, and the latched data are transferred by being circulated through circuits constituting the respective data input/output control blocks 300_1, 300_2 and 300_n. The data transferred by being circulated through the respective data input/output control blocks 300_1, 300_2 and 300_n are sequentially outputted through the one test data output pad 104. As a consequence, data may be latched and transferred by being circulated through a plurality of respective data input/output control blocks by using a one test data input pad, and the data circulated and transferred may be outputted by using a one test data output pad. Therefore, it is possible to test at a time a plurality of data input/output control blocks for transferring data inputted from an outside to an inside of a semiconductor apparatus or transferring data of the inside of the semiconductor apparatus to the outside.

Even though the number of data input/output control blocks increases as the number of data input/output pads increases, when performing a test for determining whether the data input/output control blocks normally operate or not, the semiconductor apparatus in accordance with the embodiments may perform the test by using only a predetermined number of test pads.

Currently, while a semiconductor apparatus and a controller are used by being stacked, the semiconductor apparatus and the controller are electrically coupled with each other by bumps. Since the size of each of the bumps is smaller than a generally used pad, the bumps cannot be electrically coupled with the lines of test equipment. In this case, a test may be performed by electrically coupling pads to the bumps. In the case where the number of data input/output bumps is large, all the pads with a size larger than the bumps may not be electrically coupled to the bumps. In this case, by electrically coupling a predetermined number of pads to the bumps as in the embodiments, it is possible to test whether data input/output control blocks of the semiconductor apparatus operate normally.

Figure 5:
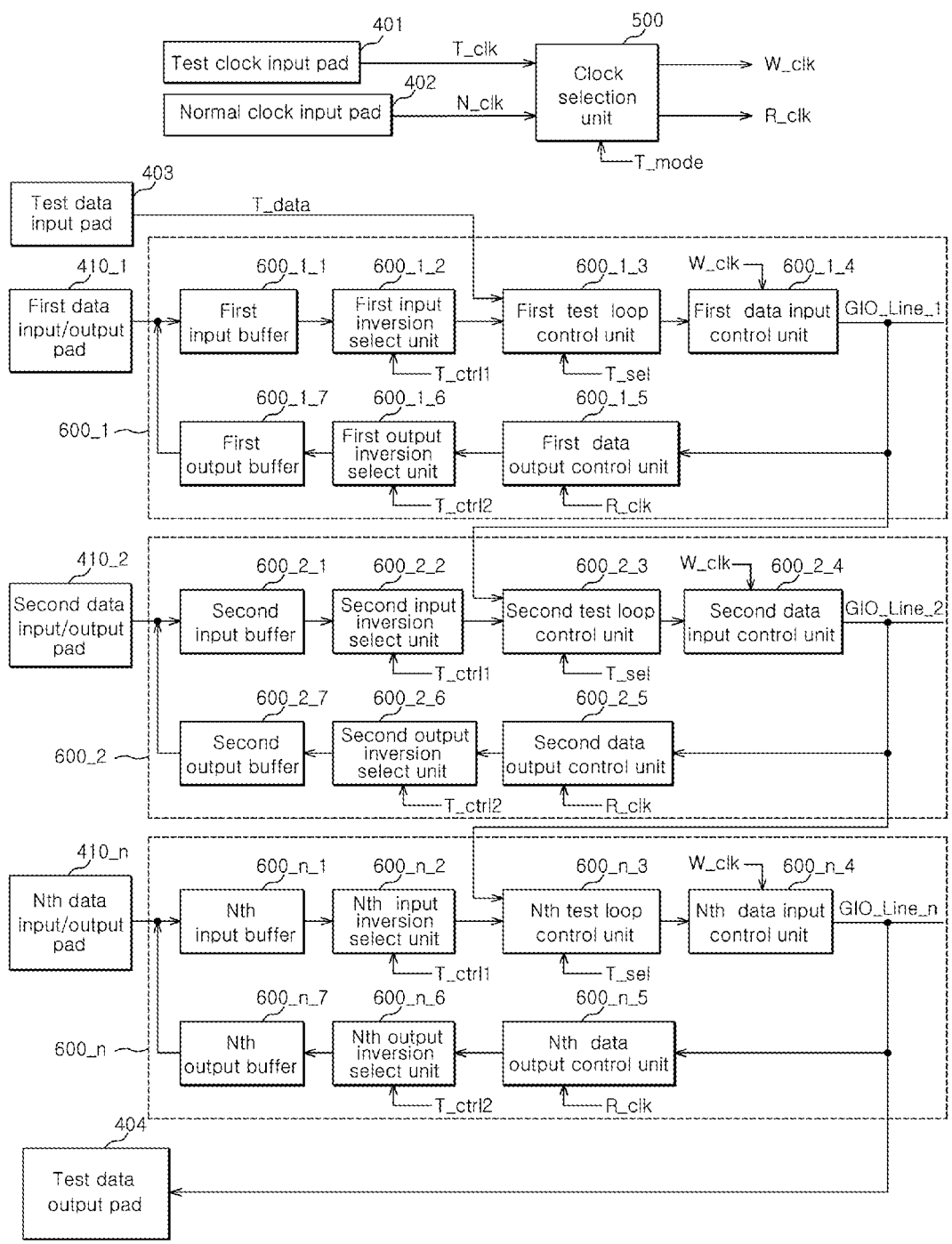
FIG. 5 is a configuration diagram of a semiconductor apparatus in accordance with an embodiment.

Referring to FIG. 5, a semiconductor apparatus in accordance with an embodiment may include a test clock input pad 401, a normal clock input pad 402, a test data input pad 403, first to $n^{th}$ data input/output pads 410_1 to 410_n, a test data output pad 404, a clock selection unit 500, and first to $n^{th}$ data input/output control blocks 600_1 to 600_n.

The test clock input pad 401 may be configured to transfer a test clock T_clk from an outside to an inside of the semiconductor apparatus in a test.

The normal clock input pad 402 may be configured to transfer a normal clock N_clk from an outside to an inside of the semiconductor apparatus not in the test mode but in a normal mode.

The test data input pad 403 may be configured to transfer test data T_data from an outside to an inside of the semiconductor apparatus in the test mode.

Each of the first to $n^{th}$ data input/output pads 410_1 to 410_n may be configured to transfer data from an outside to an inside of the semiconductor apparatus in the normal.

The test data output pad 404 may be configured to transfer the data outputted from an inside of the semiconductor apparatus to an outside of the semiconductor apparatus in the test mode. For example, the test data output pad 404 transfers the data outputted from the n$^{th}$ data input/output control block 600_*n* to an outside of the semiconductor apparatus.

The clock selection unit 500 may be configured to output the normal clock N_clk as a write clock W_clk and a read clock R_clk in the normal mode, and output the test clock T_clk as the write clock W_clk and the read clock R_clk in the test mode. For example, the clock selection unit 500 outputs the normal clock N_clk as the write clock W_clk and the read clock R_clk when a test mode signal T_mode is disabled. Also, the clock selection unit 500 outputs the test clock T_clk as the write clock W_clk and the read clock R_clk when the test mode signal T_mode is enabled.

Figure 6:
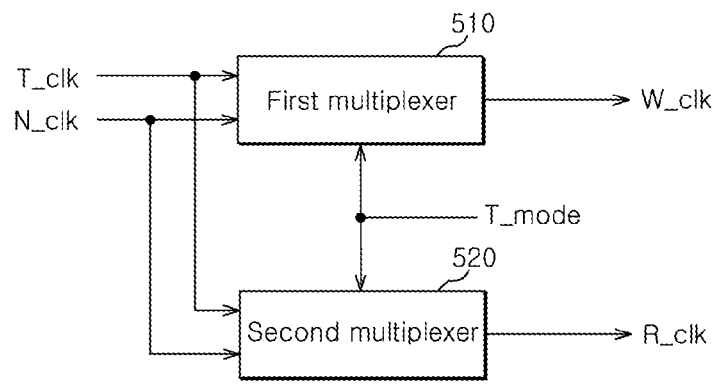
FIG. 6 is a configuration diagram of the clock selection unit of FIG. 5.

Referring to FIG. 6, the clock selection unit 500 may include first and second multiplexers 510 and 520. The first multiplexer 510 outputs one of the test clock T_clk and the normal clock N_clk as the write clock W_clk in response to the test mode signal T_mode. For example, the first multiplexer 510 outputs the test clock T_clk as the write clock W_clk when the test mode signal T_mode is enabled, and outputs the normal clock N_clk as the write clock W_clk when the test mode signal T_mode is disabled. The second multiplexer 520 outputs one of the test clock T_clk and the normal clock N_clk as the read clock R_clk in response to the test mode signal T_mode. For example, the second multiplexer 520 outputs the test clock T_clk as the read clock R_clk when the test mode signal T_mode is enabled, and outputs the normal clock N_clk as the read clock R_clk when the test mode signal T_mode is disabled.

The first data input/output control block 600_1 may be configured to transfer the data inputted from the first data input/output pad 410_1, to a first data input/output line GIO_line_1, and transfer the data inputted from the first data input/output line GIO_line_1, to the first data input/output pad 410_1, in the normal mode. Further, the first data input/output control block 600_1 may be configured to transfer the test data T_data inputted from the test data input pad 403 to the second data input/output control block 600_2, in the test mode.

The first data input/output control block 600_1 may include a first input buffer 600_1_1, a first input inversion select unit 600_1_2, a first test loop control unit 600_1_3, a first data input control unit 600_1_4, a first data output control unit 600_1_5, a first output inversion select unit 600_1_6, and a first output buffer 600_1_7.

The first input buffer 600_1_1 is electrically coupled with the first data input/output pad 410_1 and may be configured to buffer and output the data inputted from the first data input/output pad 410_1.

The first input inversion select unit 600_1_2 may be configured to output the output of the first input buffer 600_1_1 by inverting or non-inverting it in response to a first test control signal T_ctrl1. For example, the first input inversion select unit 600_1_2 outputs the output of the first input buffer 600_1_1 by inverting it when the first test control signal T_ctrl1 is enabled, and outputs the output of the first input buffer 600_1_1 by non-inverting it when the first test control signal T_ctrl1 is disabled.

Referring to FIG. 3, the first input inversion select unit 600_1_2 may include first and second inverters IV11 and IV12, a control inverter IVC11, and a pass gate PG11. The first inverter IV11 is inputted with the first test control signal T_ctrl1. The control inverter IVC11 has a first control terminal which is inputted with the first test control signal T_ctrl1, a second control terminal which is inputted with the output signal of the first inverter IV11, and an input terminal which is inputted with an input signal IN, that is, the output signal of the first input buffer 600_1_1. The pass gate PG11 has a first control terminal which is inputted with the output signal of the first inverter IV11, a second control terminal which is inputted with the first test control signal T_ctrl1, and an input terminal which is inputted with the input signal IN, that is, the output signal of the first input buffer 600_1_1. The output terminal of the control inverter IVC11 and the output terminal of the pass gate PG11 are electrically coupled with each other. The second inverter IV12 has an input terminal to which the electrically coupled node of the output terminals of the control inverter IVC11 and the pass gate PG11 is electrically coupled, and an output terminal which outputs an output signal OUT.

The first test loop control unit 600_1_3 may be configured to output one of the test data T_data and the output signal of the first input inversion select unit 600_1_2 in response to a test select signal T_sel. For example, the first test loop control unit 600_1_3 outputs the test data T_data when the test select signal T_sel is enabled, and outputs the output signal of the first input inversion select unit 600_1_2 when the test select signal T_sel is disabled. The first test loop control unit 600_1_3 may be configured by a multiplexer.

The first data input control unit 600_1_4 may be configured to output the output of the first test loop control unit 600_1_3 to the first data input/output line GIO_line_1 in response to the write clock W_clk. For example, the first data input control unit 600_1_4 latches the output of the first test loop control unit 600_1_3 when the write clock W_clk transitions to a specified level, and outputs a resultant signal to the first data input/output line GIO_line_1. The first data input control unit 600_1_4 may be configured by a flip-flop.

The first data output control unit 600_1_5 may be configured to latch the signal of the first data input/output line GIO_line_1 in response to the read clock R_clk and output a resultant signal. For example, the first data output control unit 600_1_5 latches the signal of the first data input/output line GIO_line_1 when the read clock R_clk transitions to a specified level and outputs a resultant signal. The first data output control unit 600_1_5 may be configured by a flip-flop.

The first output inversion select unit 600_1_6 may be configured to output the output signal of the first data output control unit 600_1_5 by inverting or non-inverting it in response to a second test control signal T_ctrl2. For example, the first output inversion select unit 600_1_6 outputs the output signal of the first data output control unit 600_1_5 by inverting it when the second test control signal T_ctrl2 is enabled, and outputs the output signal of the first data output control unit 600_1_5 by non-inverting it when the second test control signal T_ctrl2 is disabled. The first output inversion select unit 600_1_6 may be configured in the same manner as the first input inversion select unit 600_1_2 except that input signals and output signals are different.

The first output buffer 600_1_7 may be configured to buffer the output of the first output inversion select unit 600_1_6 and output a resultant signal to the node to which the first data input/output pad 410_1 and the first input buffer 600_1_1 are electrically coupled.

The second data input/output control block 600_2 may be configured to transfer the data inputted from the second data input/output pad 410_2, to a second data input/output line GIO_line_2, and transfer the data inputted from the second data input/output line GIO_line_2, to the second data input/output pad 410_2, in the normal mode. Further, the second data input/output control block 600_2 may be configured to transfer the data inputted from the first data input/output control block 600_1 to the third data input/output control block, in the test mode.

The second data input/output control block 600_2 may include a second input buffer 600_2_1, a second input inversion select unit 600_2_2, a second test loop control unit 600_2_3, a second data input control unit 600_2_4, a second data output control unit 600_2_5, a second output inversion select unit 600_2_6, and a second output buffer 600_2_7.

The second input buffer 600_2_1 is electrically coupled with the second data input/output pad 410_2 and may be configured to buffer and output the data inputted from the second data input/output pad 410_2.

The second input inversion select unit 600_2_2 may be configured to output the output of the second input buffer 600_2_1 by inverting or non-inverting it in response to the first test control signal T_ctrl1. For example, the second input inversion select unit 600_2_2 outputs the output of the second input buffer 600_2_1 by inverting it when the first test control signal T_ctrl1 is enabled, and outputs the output of the second input buffer 600_2_1 by non-inverting it when the first test control signal T_ctrl1 is disabled.

The second input inversion select unit 600_2_2 may be configured in the same manner as the first input inversion select unit 600_1_2 except that input signals and output signals are different.

The second test loop control unit 600_2_3 may be configured to output one of the output signal of the first data input/output control block 600_1 and the output signal of the second input inversion select unit 600_2_2 in response to the test select signal T_sel. For example, the second test loop control unit 600_2_3 outputs the output signal of the first data input/output control block 600_1 when the test select signal T_sel is enabled, and outputs the output signal of the second input inversion select unit 600_2_2 when the test select signal T_sel is disabled. The second test loop control unit 600_2_3 may be configured by a multiplexer.

The second data input control unit 600_2_4 may be configured to output the output of the second test loop control unit 600_2_3 to the second data input/output line GIO_line_2 in response to the write clock W_clk. For example, the second data input control unit 600_2_4 latches the output of the second test loop control unit 600_2_3 when the write clock W_clk transitions to the specified level, and outputs a resultant signal to the second data input/output line GIO_line_2. The second data input control unit 600_2_4 may be configured by a flip-flop.

The second data output control unit 600_2_5 may be configured to latch the signal of the second data input/output line GIO_line_2 in response to the read clock R_clk and output a resultant signal. For example, the second data output control unit 600_2_5 latches the signal of the second data input/output line GIO_line_2 when the read clock R_clk transitions to the specified level and outputs a resultant signal. The second data output control unit 600_2_5 may be configured by a flip-flop.

The second output inversion select unit 600_2_6 may be configured to output the output signal of the second data output control unit 600_2_5 by inverting or non-inverting it in response to the second test control signal T_ctrl2. For example, the second output inversion select unit 600_2_6 outputs the output signal of the second data output control unit 600_2_5 by inverting it when the second test control signal T_ctrl2 is enabled, and outputs the output signal of the second data output control unit 600_2_5 by non-inverting it when the second test control signal T_ctrl2 is disabled. The second output inversion select unit 600_2_6 may be configured in the same manner as the first input inversion select unit 600_1_2 except that input signals and output signals are different.

The second output buffer 600_2_7 may be configured to buffer the output of the second output inversion select unit 600_2_6 and output a resultant signal to the node to which the second data input/output pad 410_2 and the second input buffer 600_2_1 are electrically coupled.

The $n^{th}$ data input/output control block 600_$n$ may be configured to transfer the data inputted from the $n^{th}$ data input/output pad 410_$n$, to an $n^{th}$ data input/output line GIO_line_n, and transfer the data inputted from the $n^{th}$ data input/output line GIO_line_n, to the $n^{th}$ data input/output pad 410_$n$, in the normal mode. Further, the $n^{th}$ data input/output control block 600_$n$ may be configured to transfer the data inputted from the n−$1^{th}$ data input/output control block to the test data output pad 404, in the test mode.

The $n^{th}$ data input/output control block 600_$n$ may include an $n^{th}$ input buffer 600_$n$_1, an $n^{th}$ input inversion select unit 600_$n$_2, an $n^{th}$ test loop control unit 600_$n$_3, an $n^{th}$ data input control unit 600_$n$_4, an $n^{th}$ data output control unit 600_$n$_5, an $n^{th}$ output inversion select unit 600_$n$_6, and an $n^{th}$ output buffer 600_$n$_7.

The $n^{th}$ input buffer 600_$n$_1 is electrically coupled with the $n^{th}$ data input/output pad 410_$n$ and may be configured to buffer and output the data inputted from the $n^{th}$ data input/output pad 410_$n$.

The $n^{th}$ input inversion select unit 600_$n$_2 may be configured to output the output of the $n^{th}$ input buffer 600_$n$_1 by inverting or non-inverting it in response to the first test control signal T_ctrl1. For example, the $n^{th}$ input inversion select unit 600_$n$_2 outputs the output of the $n^{th}$ input buffer 600_$n$_1 by inverting it when the first test control signal T_ctrl1 is enabled, and outputs the output of the $n^{th}$ input buffer 600_$n$_1 by non-inverting it when the first test control signal T_ctrl1 is disabled.

The $n^{th}$ input inversion select unit 600_$n$_2 may be configured in the same manner as the first input inversion select unit 600_1_2 except that input signals and output signals are different.

The $n^{th}$ test loop control unit 600_$n$_3 may be configured to output one of the output signal of the n−$1^{th}$ data input/output control block and the output signal of the $n^{th}$ input inversion select unit 600_$n$_2 in response to the test select signal T_sel. For example, the $n^{th}$ test loop control unit 600_$n$_3 outputs the output signal of the n−$1^{th}$ data input/output control block when the test select signal T_sel is enabled, and outputs the output signal of the $n^{th}$ input inversion select unit 600_$n$_2 when the test select signal T_sel is disabled. The $n^{th}$ test loop control unit 600_$n$_3 may be configured by a multiplexer.

The $n^{th}$ data input control unit 600_$n$_4 may be configured to output the output of the $n^{th}$ test loop control unit 600_$n$_3 to the $n^{th}$ data input/output line GIO_line_2 in response to the write clock W_clk. For example, the $n^{th}$ data input control unit 600_$n$_4 latches the output of the $n^{th}$ test loop control unit 600_$n$_3 when the write clock W_clk transitions to the specified level, and outputs a resultant signal to the $n^{th}$ data input/output line GIO_line_n. The $n^{th}$ data input control unit 600_$n$_4 may be configured by a flip-flop.

The $n^{th}$ data output control unit 600_$n$_5 may be configured to latch the signal of the $n^{th}$ data input/output line GIO_line_n in response to the read clock R_clk and output a resultant signal. For example, the $n^{th}$ data output control unit 600_$n$_5 latches the signal of the $n^{th}$ data input/output line GIO_line_n when the read clock R_clk transitions to the specified level and outputs a resultant signal. The $n^{th}$ data output control unit 600_$n$_5 may be configured by a flip-flop.

The $n^{th}$ output inversion select unit 600_$n$_6 may be configured to output the output signal of the $n^{th}$ data output control unit 600_$n$_5 by inverting or non-inverting it in response to the second test control signal T_ctrl2. For example, the $n^{th}$ output inversion select unit 600_n_6 outputs the output signal of the $n^{th}$ data output control unit 600_n_5 by inverting it when the second test control signal T_ctrl2 is enabled, and outputs the output signal of the $n^{th}$ data output control unit 600_n_5 by non-inverting it when the second test control signal T_ctrl2 is disabled. The $n^{th}$ output inversion select unit 600_n_6 may be configured in the same manner as the first input inversion select unit 600_1_2 except that input signals and output signals are different.

The $n^{th}$ output buffer 600_n_7 may be configured to buffer the output of the $n^{th}$ output inversion select unit 600_n_6 and output a resultant signal to the node to which the $n^{th}$ data input/output pad 410_n and the $n^{th}$ input buffer 600_n_1 are electrically coupled.

Operations of the semiconductor apparatus in accordance with the present embodiments, configured as mentioned above, will be described below.

Operations in the normal, that is, in the case where the test mode signal T_mode is disabled and data are inputted from an outside to the semiconductor apparatus, will be described.

The clock selection unit 500 outputs the normal clock N_clk as the write clock W_clk and the read clock R_clk when the test mode signal T_mode is disabled.

The first data input/output control block 600_1 transfers the data inputted from the first data input/output pad 410_1, through the first input buffer 600_1_1, the first input inversion select unit 600_1_2, the first test loop control unit 600_1_3 and the first data input control unit 600_1_4 to the first data input/output line GIO_line_1. Since both the first test control signal T_ctrl1 and the test select signal T_sel are disabled in the normal mode, the first input inversion select unit 600_1_2 outputs the output of the first input buffer 600_1_1 by non-inverting it, and the first test loop control unit 600_1_3 transfers the output of the first input inversion select unit 600_1_2 to the first data input control unit 600_1_4. The first data input control unit 600_1_4 latches the output of the first test loop control unit 600_1_3 when the write clock W_clk transitions to the specified level, and outputs a resultant signal to the first data input/output line GIO_line_1.

The second data input/output control block 600_2 transfers the data inputted from the second data input/output pad 410_2, through the second input buffer 600_2_1, the second input inversion select unit 600_2_2, the second test loop control unit 600_2_3 and the second data input control unit 600_2_4 to the second data input/output line GIO_line_2. Since both the first test control signal T_ctrl1 and the test select signal T_sel are disabled in the normal mode, the second input inversion select unit 600_2_2 outputs the output of the second input buffer 600_2_1 by non-inverting it, and the second test loop control unit 600_2_3 transfers the output of the second input inversion select unit 600_2_2 to the second data input control unit 600_2_4. The second data input control unit 600_2_4 latches the output of the second test loop control unit 600_2_3 when the write clock W_clk transitions to the specified level, and outputs a resultant signal to the second data input/output line GIO_line_2.

The $n^{th}$ data input/output control block 600_n transfers the data inputted from the $n^{th}$ data input/output pad 410_n, through the $n^{th}$ input buffer 600_n_1, the $n^{th}$ input inversion select unit 600_n_2, the $n^{th}$ test loop control unit 600_n_3 and the $n^{th}$ data input control unit 600_n_4 to the $n^{th}$ data input/output line GIO_line_n. Since both the first test control signal T_ctrl1 and the test select signal T_sel are disabled in the normal mode, the $n^{th}$ input inversion select unit 600_n_2 outputs the output of the $n^{th}$ input buffer 600_n_1 by non-inverting it, and the $n^{th}$ test loop control unit 600_n_3 transfers the output of the $n^{th}$ input inversion select unit 600_n_2 to the $n^{th}$ data input control unit 600_n_4. The $n^{th}$ data input control unit 600_n_4 latches the output of the $n^{th}$ test loop control unit 600_n_3 when the write clock W_clk transitions to the specified level, and outputs a resultant signal to the $n^{th}$ data input/output line GIO_line_n.

That is to say, when data are inputted through the respective data input/output pads 410_1, 410_2 and 410_n in the normal mode, the respective data input/output control blocks 600_1, 600_2 and 600_n include first data transfer paths (including the input buffers, the input inversion select units, the test loop control units and the data input control units) through which the data are transferred to the data input/output lines GIO_line_1, GIO_line_2 and GIO_line_n.

Operations in the normal mode, that is, in the case where the test mode signal T_mode is disabled and data are outputted from the semiconductor apparatus to an outside, will be described.

The clock selection unit 500 outputs the normal clock N_clk as the write clock W_clk and the read clock R_clk when the test mode signal T_mode is disabled.

The first data input/output control block 600_1 outputs the data inputted from the first data input/output line GIO_line_1, through the first data output control unit 600_1_5, the first output inversion select unit 600_1_6, the first output buffer 600_1_7 and the first data input/output pad 410_1 to an outside of the semiconductor apparatus. The first data output control unit 600_1_5 latches the signal of the first data input/output line GIO_line_1 in response to the read clock R_clk and outputs a resultant signal. The first output inversion select unit 600_1_6 outputs the output signal of the first data output control unit 600_1_5 by non-inverting it in response to the disabled second test control signal T_ctrl2. The first output buffer 600_1_7 outputs the output signal of the first output inversion select unit 600_1_6 to the first data input/output pad 410_1.

The second data input/output control block 600_2 outputs the data inputted from the second data input/output line GIO_line_2, through the second data output control unit 600_2_5, the second output inversion select unit 600_2_6, the second output buffer 600_2_7 and the second data input/output pad 410_2 to an outside of the semiconductor apparatus. The second data output control unit 600_2_5 latches the signal of the second data input/output line GIO_line_2 in response to the read clock R_clk and outputs a resultant signal. The second output inversion select unit 600_2_6 outputs the output signal of the second data output control unit 600_2_5 by non-inverting it in response to the disabled second test control signal T_ctrl2. The second output buffer 600_2_7 outputs the output signal of the second output inversion select unit 600_2_6 to the second data input/output pad 410_2.

The $n^{th}$ data input/output control block 600_n outputs the data inputted from the $n^{th}$ data input/output line GIO_line_n, through the $n^{th}$ data output control unit 600_n_5, the $n^{th}$ output inversion select unit 600_n_6, the $n^{th}$ output buffer 600_n_7 and the $n^{th}$ data input/output pad 410_n to an outside of the semiconductor apparatus. The $n^{th}$ data output control unit 600_n_5 latches the signal of the $n^{th}$ data input/output line GIO_line_n in response to the read clock R_clk and outputs a resultant signal. The $n^{th}$ output inversion select unit 600_n_6 outputs the output signal of the $n^{th}$ data output control unit 600_n_5 by non-inverting it in response to the disabled second test control signal T_ctrl2. The $n^{th}$ output buffer 600_n_7 outputs the output signal of the $n^{th}$ output inversion select unit 600_n_6 to the $n^{th}$ data input/output pad 410_n.

That is to say, the respective data input/output control blocks 600_1, 600_2 and 600_n include second data transfer paths (including the data output control units, the output inversion select units and the output buffers) through which the signals of the respective data input/output lines GIO_line_1, GIO_line_2 and GIO_line_n are respectively transferred to the data input/output pads 410_1, 410_2 and 410_n in the normal mode.

Operations not in the normal mode but in the test mode, that is, in the case where the test mode signal T_mode is enabled, will be described.

When the test mode signal T_mode is enabled, the clock selection unit 500 outputs the test clock T_clk as the read clock R_clk and the write clock W_clk.

After the test select signal T_sel is enabled, the test data T_data is applied from the test data input pad 403. When the test select signal T_sel is enabled, the first test loop control unit 600_1_3 transfers the test data T_data to the first data input control unit 600_1_4. The first data input control unit 600_1_4 latches the output signal of the first test loop control unit 600_1_3 when the write clock W_clk transitions to the specified level, and outputs a resultant signal.

When the test select signal T_sel is enabled, the second test loop control unit 600_2_3 transfers the output signal of the first data input control unit 600_1_4 to the second data input control unit 600_2_4. The second data input control unit 600_2_4 latches the output signal of the second test loop control unit 600_2_3 when the write clock W_clk transitions to the specified level, and outputs a resultant signal.

When the test select signal T_sel is enabled, the $n^{th}$ test loop control unit 600_n_3 transfers the output signal of the $n-1^{th}$ data input control unit to the $n^{th}$ data input control unit 600_n_4. The $n^{th}$ data input control unit 600_n_4 latches the output signal of the $n^{th}$ test loop control unit 600_n_3 when the write clock W_clk transitions to the specified level, and outputs a resultant signal.

After the test data T_data is latched by all of the first to $n^{th}$ respective data input control units 600_1_4 to 600_n_4, the test select signal T_sel is disabled.

The data latched by the first data input control unit 600_1_4 is transferred back to the first data input control unit 600_1_4 via the first data output control unit 600_1_5, the first output inversion select unit 600_1_6, the first output buffer 600_1_7, the first input buffer 600_1_1, the first input inversion select unit 600_1_2 and the first test loop control unit 600_1_3 after the test select signal T_sel is disabled. That is to say, after the test select signal T_sel is disabled, the data latched by the first data input control unit 600_1_4 is transferred by being circulated through all the component elements constituting the first data input/output control block 600_1. The first input inversion select unit 600_1_2 outputs the output signal of the first input buffer 600_1_1 to the first test loop control unit 600_1_3 by non-inverting it in response to the disabled first test control signal T_ctrl1. The first output inversion select unit 600_1_6 outputs the output signal of the first data output control unit 600_1_5 to the first output buffer 600_1_7 by non-inverting it in response to the disabled second test control signal T_ctrl2. The data value of the first data input/output control block 600_1 transferred by being circulated may be changed by the first and second test control signals T_ctrl1 and T_ctrl2. For example, in the case where the first test control signal T_ctrl1 is enabled, the output signal of the first input buffer 600_1_1 may be transferred to the first test loop control unit 600_1_3 by being inverted. In the case where the second control signal T_ctrl2 is enabled, the output signal of the first data output control unit 600_1_5 may be transferred to the first output buffer 600_1_7 by being inverted.

The data latched by the second data input control unit 600_2_4 is transferred back to the second data input control unit 600_2_4 via the second data output control unit 600_2_5, the second output inversion select unit 600_2_6, the second output buffer 600_2_7, the second input buffer 600_2_1, the second input inversion select unit 600_2_2 and the second test loop control unit 600_2_3 after the test select signal T_sel is disabled. That is to say, after the test select signal T_sel is disabled, the data latched by the second data input control unit 600_2_4 is transferred by being circulated through all the component elements constituting the second data input/output control block 600_2. The second input inversion select unit 600_2_2 outputs the output signal of the second input buffer 600_2_1 to the second test loop control unit 600_2_3 by non-inverting it in response to the disabled first test control signal T_ctrl1. The second output inversion select unit 600_2_6 outputs the output signal of the second data output control unit 600_2_5 to the second output buffer 600_2_7 by non-inverting it in response to the disabled second test control signal T_ctrl2. The data value of the second data input/output control block 600_2 transferred by being circulated may be changed by the first and second test control signals T_ctrl1 and T_ctrl2. For example, in the case where the first test control signal T_ctrl1 is enabled, the output signal of the second input buffer 600_2_1 may be transferred to the second test loop control unit 600_2_3 by being inverted. In the case where the second control signal T_ctrl2 is enabled, the output signal of the second data output control unit 600_2_5 may be transferred to the second output buffer 600_2_7 by being inverted.

The data latched by the $n^{th}$ data input control unit 600_n_4 is transferred back to the $n^{th}$ data input control unit 600_n_4 via the $n^{th}$ data output control unit 600_n_5, the $n^{th}$ output inversion select unit 600_n_6, the $n^{th}$ output buffer 600_n_7, the $n^{th}$ input buffer 600_n_1, the $n^{th}$ input inversion select unit 600_n_2 and the $n^{th}$ test loop control unit 600_n_3 after the test select signal T_sel is disabled. That is to say, after the test select signal T_sel is disabled, the data latched by the $n^{th}$ data input control unit 600_n_4 is transferred by being circulated through all the component elements constituting the $n^{th}$ data input/output control block 600_n. The $n^{th}$ input inversion select unit 600_n_2 outputs the output signal of the $n^{th}$ input buffer 600_n_1 to the $n^{th}$ test loop control unit 600_n_3 by non-inverting it in response to the disabled first test control signal T_ctrl1. The $n^{th}$ output inversion select unit 600_n_6 outputs the output signal of the $n^{th}$ data output control unit 600_n_5 to the $n^{th}$ output buffer 600_n_7 by non-inverting it in response to the disabled second test control signal T_ctrl2. The data value of the $n^{th}$ data input/output control block 600_n transferred by being circulated may be changed by the first and second test control signals T_ctrl1 and T_ctrl2. For example, in the case where the first test control signal T_ctrl1 is enabled, the output signal of the $n^{th}$ input buffer 600_n_1 may be transferred to the $n^{th}$ test loop control unit 600_n_3 by being inverted. In the case where the second control signal T_ctrl2 is enabled, the output signal of the $n^{th}$ data output control unit 600_n_5 may be transferred to the $n^{th}$ output buffer 600_n_7 by being inverted.

The data latched by the respective data input/output control blocks 600_1, 600_2 and 600_n are transferred by being circulated through the respective data input/output control blocks 600_1, 600_2 and 600_n in the case where the test select signal T_sel is disabled. That is to say, the respective data input/output control blocks 600_1, 600_2 and 600_n transfer the latched data by circulating them through the first data transfer paths (including the input buffers, the input inversion select units, the test loop control units and the data input control units) and the second data transfer paths (including the data output control units, the output inversion select units and the output buffers). Thereafter, when the test select signal T_sel is enabled, the data transferred by being circulated through the respective data input/output control blocks 600_1, 600_2 and 600_n are sequentially outputted through the test data output pad 404. In detail, in the case where the second test loop control unit 600_2_3 transfers the output signal of the first data input control unit 600_1_4 to the second data input control unit 600_2_4, the second data input control unit 600_2_4 transfers the data latched by itself to the third data input control unit through the third test loop control unit. In the case where the $n^{th}$ test loop control unit 600_n_3 transfers the output signal of the n−$1^{th}$ data input control unit to the $n^{th}$ data input control unit 600_n_4, the data latched by the $n^{th}$ data input control unit 600_n_4 is outputted through the test data output pad 404. That is to say, the data transferred by being circulated through the first to $n^{th}$ data input/output control blocks 600_1, 600_2 and 600_n are sequentially outputted through the test data output pad 404.

The semiconductor apparatus in accordance with the embodiments do not receive the data transferred by being circulated through the respective data input/output pads 410_1, 410_2 and 410_n. Instead, in the semiconductor apparatus in accordance with the embodiments, data transferred from the one test data input pad 403 are sequentially latched by the respective data input control units 600_1_4, 600_2_4 and 600_n_4 in response to the test clock T_clk, and the latched data are transferred by being circulated through circuits constituting the respective data input/output control blocks 600_1, 600_2 and 600_n. The data transferred by being circulated through the respective data input/output control blocks 600_1, 600_2 and 600_n are sequentially outputted through the one test data output pad 404. As a consequence, data may be latched and transferred by being circulated through a plurality of respective data input/output control blocks by using a one test data input pad, and the data circulated and transferred may be outputted by using a one test data output pad. Therefore, it is possible to test at a time a plurality of data input/output control blocks for transferring data inputted from an outside to an inside of a semiconductor apparatus or transferring data of the inside of the semiconductor apparatus to the outside.

Even though the number of data input/output control blocks increases as the number of data input/output pads increases, when performing a test for determining whether the data input/output control blocks normally operate or not, the semiconductor apparatus in accordance with the embodiments may perform the test by using only a predetermined number of test pads.

Currently, while a semiconductor apparatus and a controller are used by being stacked, the semiconductor apparatus and the controller are electrically coupled with each other by bumps. Since the size of each of the bumps is smaller than a generally used pad, the bumps cannot be electrically coupled with the lines of test equipment. In this case, a test may be performed by electrically coupling pads to the bumps. In the case where the number of data input/output bumps is large, all the pads with a size larger than the bumps may not be electrically coupled to the bumps. In this case, by electrically coupling a predetermined number of pads to the bumps as in the embodiments, it is possible to test whether data input/output control blocks of the semiconductor apparatus operate normally.

While various embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   an input buffer configured to receive and buffer data inputted through a node which is electrically coupled with a data input/output pad;
   a data input control unit configured to receive and transfer an output of the input buffer to a data input/output line in response to a write clock;
   a test loop control unit configured to receive a signal of the data input/output line and test latch data, output one of the signal of the data input/output line and the test latch data in response to a test mode signal;
   a data output control unit configured to receive and output an output of the test loop control unit in response to a read clock;
   an output inversion select unit configured to receive and output an output signal of the data output control unit by inverting or non-inverting it; and
   an output buffer configured to receive and buffer an output signal of the output inversion select unit and output a resultant signal to the node to which the data input/output pad and the input buffer are electrically coupled,
   wherein the data inputted by the input buffer is transferred to the output buffer through the data input control unit, the test loop control unit, the data output control unit and the output inversion select unit when the test loop control unit outputs the signal of the data input/output line.

2. The semiconductor apparatus according to claim 1, further comprising:
   an input inversion select unit configured to output an output signal of the input buffer by inverting or non-inverting it in response to a first test control signal; and
   a test data input/output control unit configured to latch test data inputted from a test data input pad in response to a test select signal and output the test latch data, or latch the output signal of the input inversion select unit and output the test latch data.

3. The semiconductor apparatus according to claim 2, wherein the input inversion select unit comprises:
   a first inverter configured to receive the first test control signal and output to a second control terminal of a control inverter and a first control terminal of a pass gate;
   the control inverter including a first control terminal configured to receive the first test control signal and an input terminal configured to receive the output signal of the input buffer;
   the pass gate including a second control terminal configured to receive the first test control signal and an input terminal configured to receive the output signal of the input buffer; and
   a second inverter configured to receive the output of the control inverter and the pass gate and output the output signal of the input buffer.

4. The semiconductor apparatus according to claim 2, wherein the output inversion select unit outputs the output signal of the data output control unit by inverting or non-inverting it in response to a second test control signal.

5. The semiconductor apparatus according to claim 2, wherein the test data input/output control unit comprises:
   a multiplexer configured to output one of the test data and the output signal of the input inversion select unit in response to the test select signal; and
   a flip-flop configured to latch an output signal of the multiplexer and output the test latch data.

6. The semiconductor apparatus according to claim 1, further comprising:
- a clock selection unit configured to fix the write clock to a specified level in the case where a test clock inputted from a test clock input pad is outputted as the read clock, in response to the test mode signal, and output a normal clock as the write clock in the case where the normal clock inputted from a normal clock input pad is outputted as the read clock, in response to the test mode signal.

7. The semiconductor apparatus according to claim 6, wherein the clock selection unit comprises:
- a first multiplexer and a second multiplexer;
- the first multiplexer configured to receive a ground voltage, the normal clock, and the test mode signal and output the write clock; and
- the second multiplexer configured to receive the test clock, the normal clock, and the test mode signal and output the read clock.

8. A semiconductor apparatus comprising:
- a first data input/output control block constituted by a first input buffer, a first data input control unit, a first input inversion select unit, a first test data input/output control unit, a first test loop control unit, a first data output control unit, a first output inversion select unit, and a first output buffer; and
- a second data input/output control block constituted by a second input buffer, a second data input control unit, a second input inversion select unit, a second test data input/output control unit, a second test loop control unit, a second data output control unit, a second output inversion select unit, and a second output buffer,
- wherein, in a test, the first test data input/output control unit latches test data and outputs first test latch data, and the first test latch data is latched again by the first test data input/output control unit by being circulated through the first test loop control unit, the first data output control unit, the first output inversion select unit, the first output buffer, the first input buffer and the first input inversion select unit, and
- wherein, in the test, the second test data input/output control unit latches the first test latch data and outputs second test latch data, and the second test latch data is latched again by the second test data input/output control unit by being circulated through the second test loop control unit, the second data output control unit, the second output inversion select unit, the second output buffer, the second input buffer and the second input inversion select unit.

9. The semiconductor apparatus according to claim 8, wherein the first and second data input control units are deactivated by receiving a write clock which is fixed to a specified level, in the test, and are activated by receiving the write clock which periodically transitions, in a normal mode.

10. The semiconductor apparatus according to claim 8,
- wherein the first and second input inversion select units output output signals of the first and second input buffers by inverting or non-inverting them in response to a first test control signal, and
- wherein the first and second output inversion select units output output signals of the first and second output control units by inverting or non-inverting them in response to a second test control signal.

11. The semiconductor apparatus according to claim 8, wherein the first test data input/output control unit latches the test data and outputs the first test latch data when a test select signal is enabled, and latches and outputs an output signal of the first input inversion select unit when the test select signal is disabled, and
- wherein the second test data input/output control unit latches the first test latch data and outputs the second test latch data when the test select signal is enabled, and latches and outputs an output signal of the second input inversion select unit when the test select signal is disabled.

12. The semiconductor apparatus according to claim 8,
- wherein the first test loop control unit transfers the first test latch data to the first data output control unit when a test mode signal is enabled, and transfers a signal of a first data input/output line which is electrically coupled with the first data input control unit, to the first data output control unit, and
- wherein the second test loop control unit transfers the second test latch data to the second data output control unit when the test mode signal is enabled, and transfers a signal of a second data input/output line which is electrically coupled with the second data input control unit, to the second data output control unit.

13. The semiconductor apparatus according to claim 8, further comprising:
- a test data output pad configured to receive the second test latch data and transfer the second test latch data to an outside of the semiconductor apparatus.

14. A semiconductor apparatus comprising:
- a first data input/output control block including a first data transfer path for transferring data inputted through a first data input/output pad, to a first data input/output line, and a second data transfer path for outputting a signal of the first data input/output line through the first data input/output pad, in a normal mode, and configured to latch test data and transfer and circulate latched test data to the first data transfer path and the second data transfer path, in a test mode; and
- a second data input/output control block including a third data transfer path for transferring data inputted through a second data input/output pad, to a second data input/output line, and a second data transfer path for outputting a signal of the second data input/output line through the second data input/output pad, in the normal mode, and configured to latch the signal of the first data input/output line and transfer and circulate latched signal to the third data transfer path and the fourth data transfer path, in the test mode,
- wherein the first data transfer path and the third data transfer path are paths used when data is inputted from an external and the second data transfer path and fourth data transfer path are paths used when data is outputted to the external.

15. The semiconductor apparatus according to claim 14, wherein the first data transfer path comprises:
- a first input buffer electrically coupled with the first data input/output pad;
- a first input inversion select unit configured to output an output signal of the first input buffer by inverting or non-inverting it in response to a first test control signal;
- a first test loop control unit configured to output one of the test data and an output signal of the first input inversion select unit in response to a test select signal; and
- a first data input control unit configured to transfer an output signal of the first test loop control unit to the first data input/output line.

16. The semiconductor apparatus according to claim 14, wherein the second data transfer path comprises:

a first data output control unit configured to latch the signal of the first data input/output line and output a resultant signal;

a first output inversion select unit configured to output an output signal of the first data output control unit by inverting or non-inverting it in response to a second test control signal; and a first output buffer configured to buffer an output signal of the first output inversion select unit and output a resultant signal to the first data input/output pad.

17. The semiconductor apparatus according to claim 15, wherein the third data transfer path comprises:

a second input buffer electrically coupled with the second data input/output pad;

a second input inversion select unit configured to output an output signal of the second input buffer by inverting or non-inverting it in response to the first test control signal;

a second test loop control unit configured to output one of the signal of the first data input/output line and an output signal of the second input inversion select unit in response to the test select signal; and a second data input control unit configured to transfer an output signal of the second test loop control unit to the second data input/output line.

18. The semiconductor apparatus according to claim 16, wherein the fourth data transfer path comprises:

a second data output control unit configured to latch the signal of the second data input/output line and output a resultant signal;

a second output inversion select unit configured to output an output signal of the second data output control unit by inverting or non-inverting it in response to the second test control signal; and a second output buffer configured to buffer an output signal of the second output inversion select unit and output a resultant signal to the second data input/output pad.

19. The semiconductor apparatus according to claim 14, wherein the second data input/output line is electrically coupled with a test data output pad.

20. A semiconductor apparatus comprising:

an input buffer configured to buffer data inputted through a node which is electrically coupled with a data input/output pad;

a data input control unit configured to transfer an output of the input buffer to a data input/output line in response to a write clock;

a test loop control unit configured to output one of a signal of the data input/output line and test latch data in response to a test mode signal;

a data output control unit configured to output an output of the test loop control unit in response to a read clock;

an output inversion select unit configured to output an output signal of the data output control unit in response to a test control signal; and an output buffer configured to buffer an output signal of the output inversion select unit and output a resultant signal to the node to which the data input/output pad and the input buffer are electrically coupled, wherein the data inputted by the input buffer is transferred to the output buffer through the data input control unit, the test loop control unit, the data output control unit and the output inversion select unit when the test loop control unit outputs the signal of the data input/output line.

* * * * *